United States Patent
Ramdani et al.

(10) Patent No.: US 7,781,295 B1
(45) Date of Patent: Aug. 24, 2010

(54) SYSTEM AND METHOD FOR PROVIDING A SINGLE DEPOSITION EMITTER/BASE IN A BIPOLAR JUNCTION TRANSISTOR

(75) Inventors: Jamal Ramdani, Scarborough, ME (US); Craig Printy, Buxton, ME (US); Steven J. Adler, Cape Elizabeth, ME (US); Andre P. Labonte, Lewiston, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/486,967

(22) Filed: Jul. 13, 2006

(51) Int. Cl.
*H01L 21/331* (2006.01)

(52) U.S. Cl. .................. 438/312; 438/341; 438/343; 257/E21.379

(58) Field of Classification Search .............. 438/205, 438/312, 341, 342, 343, 317; 257/E21.379
See application file for complete search history.

(56) References Cited

U.S. PATENT DOCUMENTS

| | | | | |
|---|---|---|---|---|
| 5,101,256 A | * | 3/1992 | Harame et al. | 257/565 |
| 5,346,840 A | * | 9/1994 | Fujioka | 438/312 |
| 5,656,514 A | * | 8/1997 | Ahlgren et al. | 438/320 |
| 7,049,240 B2 | * | 5/2006 | Fan et al. | 438/702 |
| 7,075,126 B2 | * | 7/2006 | Greenberg et al. | 257/198 |
| 7,378,324 B2 | * | 5/2008 | Adam et al. | 438/350 |
| 2003/0199153 A1 | * | 10/2003 | Kovacic et al. | 438/479 |

OTHER PUBLICATIONS

P. Deixler et al., "QUBIC4X: An fT/fmax=130/140GHz SiGe:C-BiCMOS Manufacturing Technology with Elite Passives for Emerging Microwave Applications," IEEE BCTM 12.3, 2004 IEEE, pp. 233-236.

* cited by examiner

*Primary Examiner*—Michael Trinh

(57) ABSTRACT

A system and method is disclosed for manufacturing a bipolar junction transistor that comprises an emitter/base layer that is formed by a single deposition process. In one advantageous embodiment of the invention the emitter/base layer comprises an emitter layer that comprises an epitaxially grown mono-silicon emitter. The epitaxially grown mono-silicon emitter significantly reduces the electrical resistivity of the emitter. A non-dopant impurity such as germanium is added to the base layer to endpoint a dry plasma etch process that is applied to etch the emitter/base layer.

20 Claims, 5 Drawing Sheets

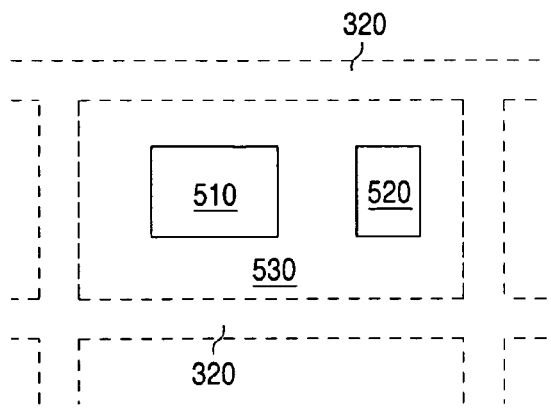
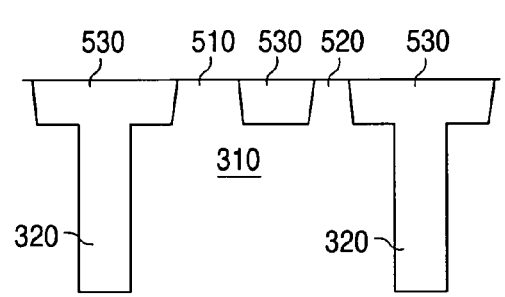
FIG. 5  FIG. 6
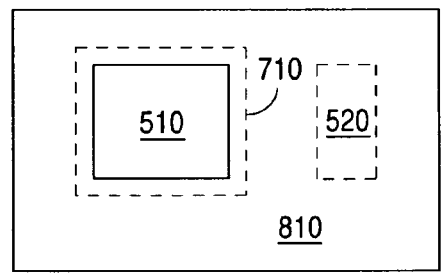
FIG. 7
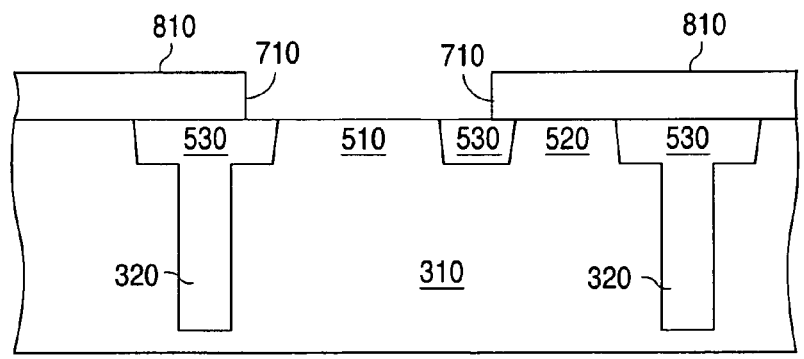
FIG. 8
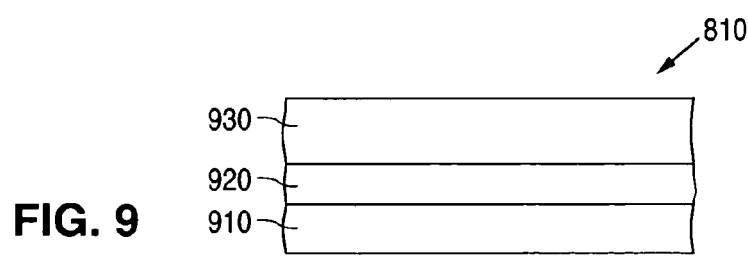
FIG. 9

SYSTEM AND METHOD FOR PROVIDING A SINGLE DEPOSITION EMITTER/BASE IN A BIPOLAR JUNCTION TRANSISTOR

TECHNICAL FIELD OF THE INVENTION

The present invention is generally directed to the manufacture of integrated circuits and, in particular, to a system and method for providing a single deposition emitter/base in a bipolar junction transistor.

CROSS REFERENCE TO RELATED APPLICATION

This patent application is related to U.S. patent application Ser. No. 11/178,557 entitled "System and Method for Controlling an Etch Process for a Single Crystal Having a Buried Layer" filed on Jul. 11, 2005. This patent application and U.S. patent application Ser. No. 11/178,557 are both owned by the same assignee. U.S. patent application Ser. No. 11/178,557 is hereby incorporated by reference in this patent application.

BACKGROUND OF THE INVENTION

As is well known, a bipolar junction transistor (BJT) comprises a collector, a base, and an emitter. A schematic representation of a cross sectional view of a prior art bipolar junction transistor 100 is illustrated in FIG. 1. A collector 110 made of silicon is isolated by shallow trench isolation (STI) structures 120. The STI structures 120 can be formed from silicon oxide or tetraethyloxysilane (TEOS) or other similar material. A silane deposition process is then employed to deposit silicon over the collector 110 and over the STI structures 120 to form a base layer 130.

As is well known in the art, the silicon that is deposited over the collector 110 forms an epitaxial base portion 140. The silicon that is deposited over the STI structures 120 forms a polysilicon base portion 150. Lastly, an emitter 160 of polysilicon is formed on top of the epitaxial base portion 140.

Recently a method has been developed that replaces the polysilicon emitter on the epitaxial base portion of a bipolar junction transistor with an epitaxially grown mono-silicon emitter. The use of an epitaxially grown mono-silicon emitter significantly reduces the emitter access resistivity. The method is described in a paper by P. Deixler et al. entitled "QUBiC4X: an $f_T/f_{max}$=130/140 GHz SiGe:C-BiCMOS Manufacturing Technology with Elite Passives for Emerging Microwave Applications" published in IEEE BCTM 12.3, pp. 233-236, 2004. This paper will hereafter be referred to as the "Deixler" reference. The Deixler reference describes the operational parameters and characteristics of an epitaxially grown mono-silicon emitter in a bipolar junction transistor.

In the method described in the Deixler reference, a two stage deposition process is used to epitaxially grow the mono-silicon emitter. The epitaxial base portion of the bipolar junction transistor is formed in a first deposition stage. Then the epitaxially grown mono-silicon emitter is formed in a second deposition stage.

Therefore, there is a need in the art for an improved system and method that can form an epitaxially grown mono-silicon emitter in a bipolar junction transistor. Specifically, there is a need in the art for an improved system and method that can form both an epitaxially grown mono-silicon emitter and a base portion of a bipolar junction transistor in a single deposition process.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIGS. 3 through 16 illustrate successive stages in the manufacture of an advantageous embodiment of a bipolar junction transistor of the present invention;

DETAILED DESCRIPTION OF THE INVENTION

FIGS. 2 through 18, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged bipolar junction transistor.

Figure 1:
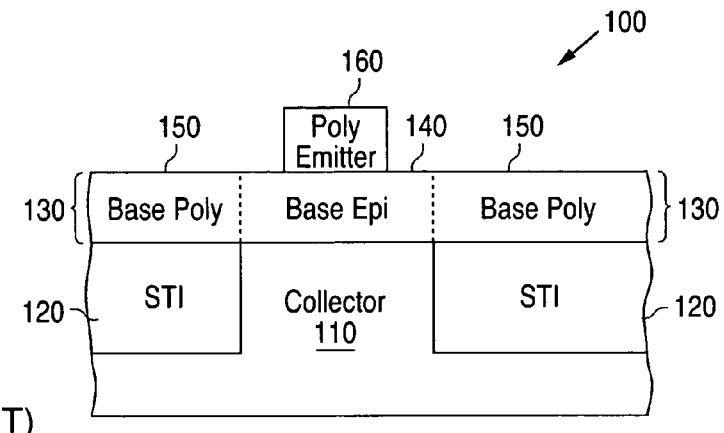
FIG. 1 illustrates a schematic cross sectional diagram of an exemplary prior art bipolar junction transistor.
Figure 2:
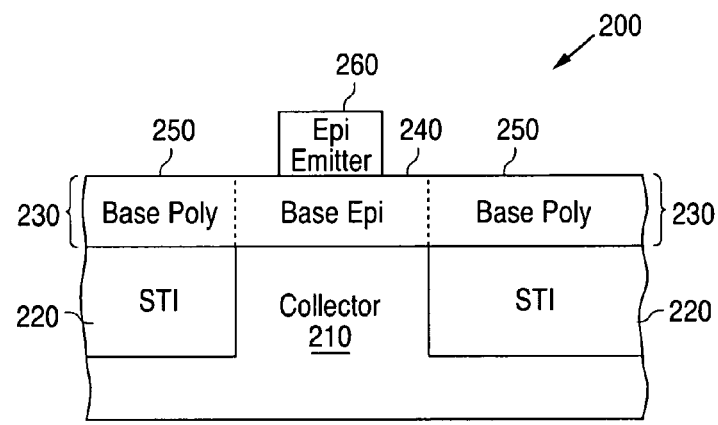
FIG. 2 illustrates a schematic cross sectional diagram of an advantageous embodiment of a bipolar junction transistor of the present invention.

FIG. 2 illustrates a schematic cross sectional diagram of an advantageous embodiment of a bipolar junction transistor 200 of the present invention. A collector 210 made of silicon is isolated by shallow trench isolation (STI) structures 220. The STI structures 220 can be formed from silicon oxide or tetraethyloxysilane (TEOS) or other similar material. As will be more fully described below, the present invention employs a single deposition process to form both the base layer 230 (that comprises epitaxial base portion 240 and polysilicon base portions 250) and the epitaxially grown mono-silicon emitter 260.

FIGS. 3 through 15 illustrate successive stages in the manufacture of an advantageous embodiment of a bipolar junction transistor 200 of the present invention.

Figure 3:
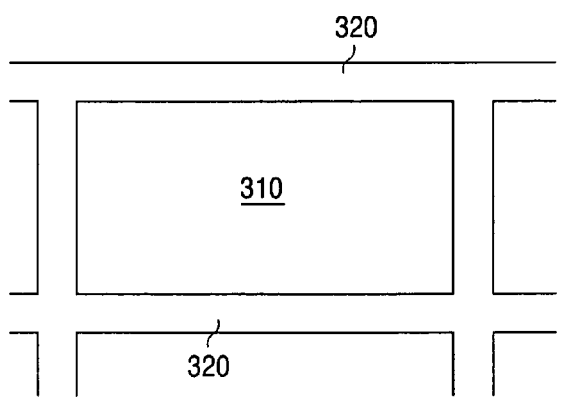
Figure 4:
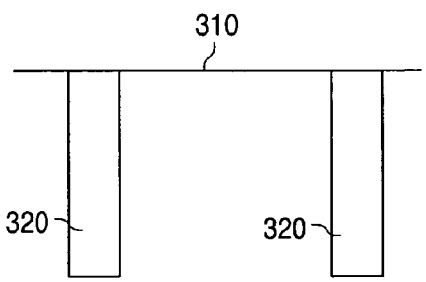

FIG. 3 illustrates a plan view of a silicon material 310 that forms the collector structure of the bipolar junction transistor 200 of the present invention. FIG. 4 illustrates a cross sectional view of the silicon material 310. As shown in FIG. 3 and in FIG. 4 conventional deep trench isolation structures 320 are provided to isolate the silicon material 310. The deep trench isolation structures 320 comprise deep trenches that are filled with silicon oxide or tetraethyloxysilane (TEOS) or polysilicon or other similar material.

In the next step of the manufacturing method of the bipolar junction transistor 200 of the present invention two areas (510 and 520) are formed in the silicon material 310 by forming shallow trench isolation structures 530. The first area 510 is the base active area (BAA) 510. The second area 520 is the collector contact area (CCA) 520. FIG. 5 illustrates a plan view of the base active area 510 and the collector contact area 520 as formed by the shallow trench isolation structures 530. The dotted lines in FIG. 5 show the location of the edges of the deep trench isolation structures 320.

FIG. 6 illustrates a cross sectional view of the base active area 510 and the collector contact area 520 as formed by the shallow trench isolation structures 530. The shallow trench isolation structures 530 comprise shallow trenches that are filled with silicon oxide or tetraethyloxysilane (TEOS) or polysilicon or other similar material. As shown in FIG. 5 and in FIG. 6, the shallow trench isolation structure 530 isolates the base active area 510 and the collector contact area 520 from each other.

In the next step of the manufacturing method of the bipolar junction transistor 200 of the present invention, a window stack material 810 is deposited over the surface of the base active area 510, and over the surface of the collector contact area 520 and over the surface of the shallow trench isolation structures 530. The composition of the window stack material 810 will be discussed more fully below. After the window stack material 810 has been deposited, portions of the window stack material 810 that are located over the base active area 510 are etched away to form a window 710 through the window stack material 810 down to the base active area 510.

FIG. 7 illustrates a plan view of the window stack material 810 after the window 710 has been etched through the window stack material 810. The dotted line in FIG. 7 shows the location of the edges of the window 710. The collector contact area 520 is shown in dotted outline in FIG. 7 because the collector contact area 520 is covered by the window stack material 810.

FIG. 8 illustrates a cross sectional view of the window 710 through the window stack material 810. As shown in FIG. 8, the base active area 510 is exposed through the window 710. The edges of the window stack material 810 at the boundary of the window 710 are located on the shallow trench isolation structure 530. The boundary of the window stack material 810 shown on the left hand side of FIG. 8 is located on the shallow trench isolation structure 530 that is located over the deep trench isolation structure 320. The boundary of the window stack material 810 shown on the right hand side of FIG. 8 is located on the shallow trench isolation structure 530 that is located between the base active area 510 and the collector contact area 520. It is understood that these locations of the boundaries of the window stack material 810 are illustrative and that the boundaries of the window stack material 810 could also be located on the base active area 510.

FIG. 9 illustrates a cross sectional view of an advantageous embodiment of the window stack material 810. The bottom layer (or layers) of the window stack material 810 are formed from dielectric materials. Although any type of dielectric material may be used, it is advantageous to use a layer of silicon oxide 910 covered by a layer of silicon nitride 920. The silicon nitride layer 920 is then covered with a layer of polysilicon 930. It is understood that this composition of the window stack material 810 is illustrative and that other types of materials may be used to form the window stack material 810.

In the next step of the manufacturing method of the bipolar junction transistor 200 of the present invention, a single deposition process is employed to deposit silicon to form both the base layer and the mono-silicon emitter layer of the transistor. Prior art methods apply a first deposition process to create the base layer of the transistor and then apply a second deposition process to create the emitter layer of the transistor.

Figure 10:
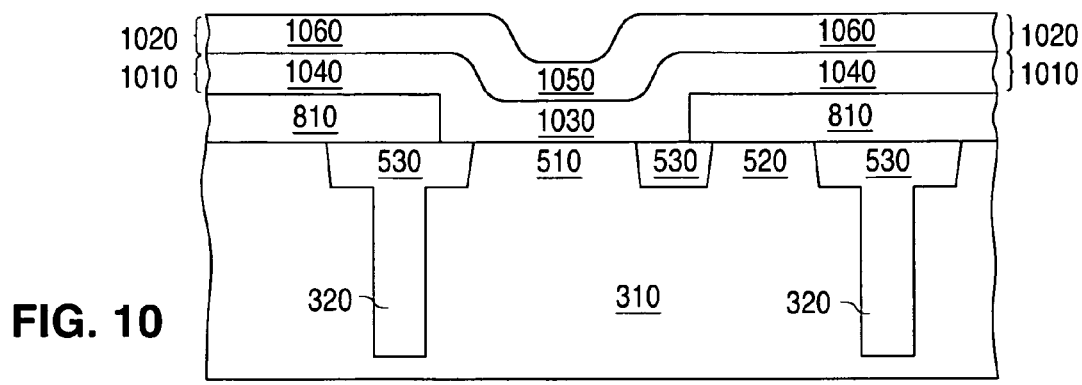

The structure shown in FIG. 8 is subjected to the silicon deposition process of the present invention. As shown in FIG. 10, the silicon deposition process deposits silicon that forms a base layer 1010 and an emitter layer 1020. The silicon material that is deposited over the base active area 510 forms an epitaxial base portion 1030. The silicon material that is deposited over the polysilicon 930 of the window stack material 810 forms a polysilicon base portion 1040. The base layer 1010 comprises the epitaxial base portion 1030 and the polysilicon base portions 1040.

Similarly, the silicon material that is deposited over the epitaxial base portion 1030 forms an epitaxial mono-emitter 1050. The silicon material that is deposited over the polysilicon base portion 1040 forms a polysilicon emitter portion 1060. The emitter layer 1020 comprises the epitaxial mono-emitter 1050 and the polysilicon emitter portions 1060.

The silicon deposition process of the present invention that forms base layer 1010 is carried out as follows. During the first portion of the silicon deposition process, silicon is deposited on the window stack material 810 and the base active area 510 (and on the edges of the shallow trench isolation structures 530 that are visible through the window 710). This silicon deposition process deposits substantially only silicon. That is, although there may be some traces of other elements deposited along with the silicon, the deposition process deposits substantially only silicon. For convenience of description, this deposition process will be referred to as a "pure silicon" deposition process even though in fact the silicon is not technically one hundred percent "pure silicon" and there may be other elements present in small quantities within the silicon that is deposited.

Figure 11:
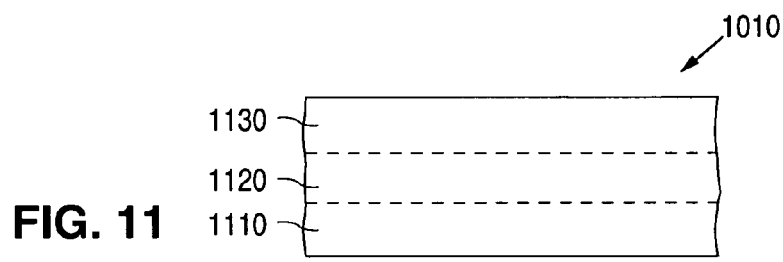

A cross sectional view of the base layer 1010 of the present invention is shown in FIG. 11. The pure silicon deposition process forms a first silicon layer 1110 on the bottom of the base layer 1010. Then at a selected point during the same silicon deposition process, the application of pure silicon ceases and the application of silicon mixed with an impurity material such as Germanium (Ge) begins. The impurity material is chosen so that the atoms of the impurity material replace the silicon atoms in the crystal lattice so that the deposited material (i.e., silicon with the impurity material) maintains the form of the silicon crystal structure. Although Germanium (Ge) may be used in one advantageous embodiment, it is also possible to use other types of impurity materials and dopants such as Carbon (C) or Boron (B) or phosphorus (P) or arsenic (As) or antimony (Sb) to control the electrical properties in the base layer 1010, etc.

The silicon deposition process that deposits silicon together with an appropriate impurity material will be referred to as a "silicon with impurity material" deposition process. As shown in FIG. 11, the "silicon with impurity material" deposition process forms a second silicon layer 1120 on top of the first silicon layer 1110. The second silicon layer 1120 comprises a crystalline lattice of silicon atoms with the impurity material atoms located within the crystalline lattice of silicon atoms.

Then at a selected point during the same silicon deposition process, the application of silicon mixed with the impurity material ceases and the application of pure silicon is resumed. The resumption of the "pure silicon" deposition process forms a third silicon layer 1130 on top of the second silicon layer 1120. The third silicon layer 1130 comprises a crystalline lattice of silicon with no impurity material atoms. The result is a base layer 1010 that comprises a first layer of pure silicon 1110, a second layer of silicon with impurity material 1120, and a third layer of pure silicon 1130.

In the next step of the manufacturing method of the bipolar junction transistor 200 of the present invention, a resist mask 1210 (shown in dotted outline in FIG. 12) is placed over a central portion of the epitaxial mono-emitter 1050 of the structure shown in FIG. 10. Then a plasma etch process is applied. The plasma etch process that is applied uses the technique described in U.S. patent application Ser. No. 11/178,557 entitled "System and Method for Controlling an Etch Process for a Single Crystal Having a Buried Layer" that has previously been incorporated by reference in this patent document.

Figure 12:
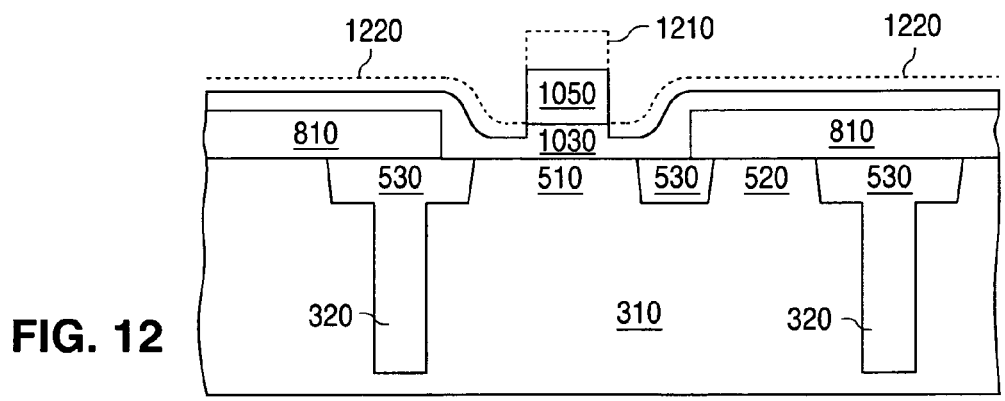

As shown in FIG. 12, the plasma etch etches away all of the exposed portions of the emitter layer 1020 that are not located under the resist mask 1210. The plasma etch also etches away all of the exposed portions of the third silicon layer 1130 of the base layer 1010 that are not located under the resist mask 1210. As more fully described in U.S. patent application Ser. No. 11/178,557, the plasma etch stops when the plasma etch reaches the top of the second silicon layer 1120.

The dotted line 1220 in FIG. 12 shows the location of the previous interface between the emitter layer 1020 and the top layer (third silicon layer 1130) of the base layer 1010. Only the portion of the base layer 1010 under the resist mask 1210 (i.e., the unetched portions of epitaxial base portion 1030) retains its top layer (i.e. third silicon layer 1130). The exposed portions of the emitter layer 1020 have been etched away. The exposed portions of the base layer 1010 have been etched away down to the top of the second silicon layer 1120.

In the next step of the manufacturing method of the bipolar junction transistor 200 of the present invention, resist mask 1210 is removed and a dielectric layer 1310 is deposited over the epitaxial mono-emitter 1050 and over the exposed portions of the second silicon layer 1120 of base layer 1010 to act as a barrier layer. Then insulating spacer structures 1320 are added to the sides of the epitaxial mono-emitter 1050 to ensure proper spacing of the extrinsic base. The result of adding these structures is shown in FIG. 13.

In the next step of the manufacturing method of the bipolar junction transistor 200 of the present invention, a base (extrinsic) implant and/or salicide is then applied to make the extrinsic base highly conducting.

Figure 13:
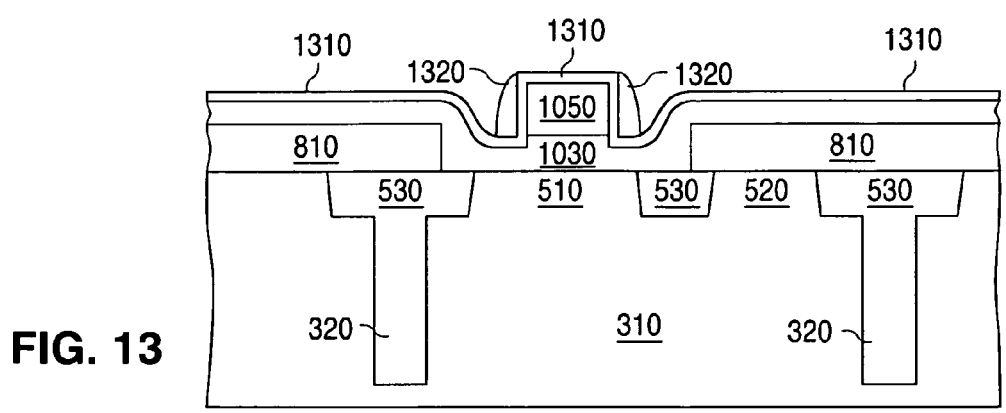
Figure 14:
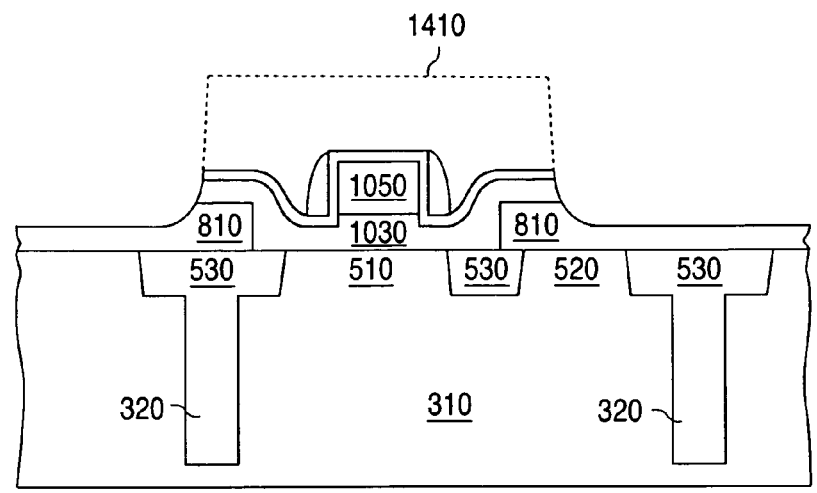

In the next step of the manufacturing method of the bipolar junction transistor 200 of the present invention, a resist mask 1410 (shown in dotted outline in FIG. 14) is placed over a central portion of the structure shown in FIG. 13. Then a dry plasma etch process is applied. The dry plasma etch etches away the exposed portions of the dielectric layer 1310 and the exposed portions of the polysilicon base portion 1040 (now comprising only first silicon layer 1110 and second silicon layer 1120) down to the topmost dielectric layer in the window stack 810 (in this embodiment the layer of silicon nitride 920).

Figure 15:
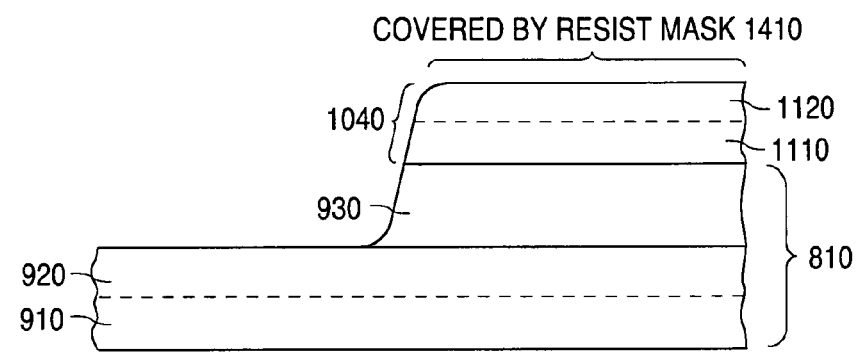

FIG. 15 illustrates a cross sectional diagram showing the relationship of the remaining layers (1110 and 1120) of the polysilicon base portion 1040 to the layers (910, 920, 930) of the window stack 810. The dry plasma etch etches away the exposed portions of the polysilicon base portion 1040 and the exposed portions of the polysilicon layer 930 of the window stack 810. (For clarity the dielectric layer portions 1310 covered by the resist mask 1410 are not shown in FIG. 15.)

Figure 16:
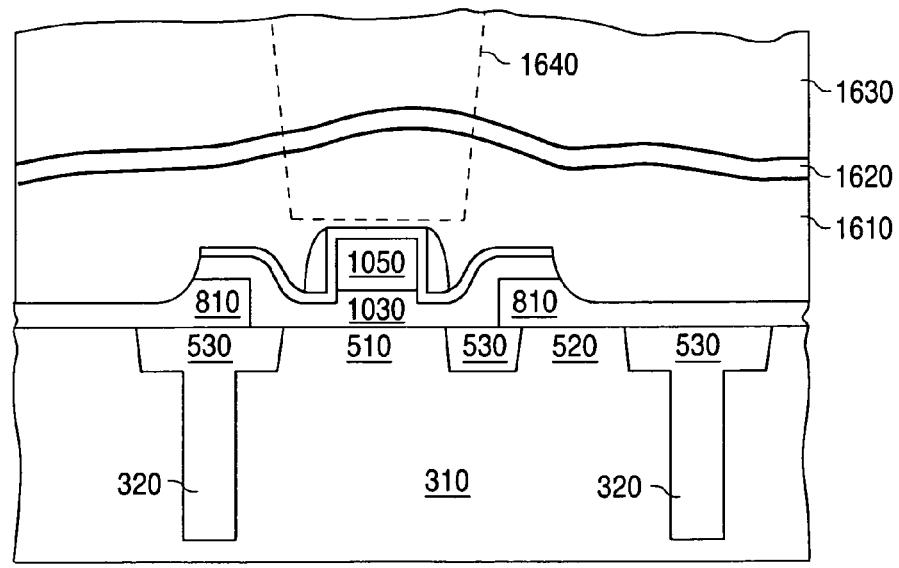

FIG. 16 illustrates a cross sectional diagram showing an exemplary contact zone for the mono-silicon emitter 1050 of the bipolar junction transistor 200 of the present invention. The mono-silicon emitter 1050 of the present invention does not need to be large enough for a contact to land completely on the emitter 1050. The contact may be larger than the emitter 1050 provided that a good contact can be established.

A three layer dielectric system is illustrated in FIG. 16 for reliably landing a contact on the emitter 1050. The sizes of the three dielectric layers are enlarged for clarity of explanation and are not drawn to scale. A first dielectric layer 1610 is deposited over the structure shown in FIG. 14 (with resist mask 1410 removed). A second dielectric layer 1620 (an etch stop dielectric) is then deposited over the first dielectric layer 1610. Then a third dielectric layer 1630 is deposited over the second dielectric layer 1620. A contact zone 1640 for the emitter 1050 is shown in dotted outline in FIG. 16.

The third dielectric layer 1630 is relatively thick compared to the first dielectric layer 1610 and compared to the second dielectric layer 1620. The relatively thin etch stop dielectric (second dielectric layer 1620) allows a dielectric etch process to stop at a specified height above the contact points. Then a final etch process through the first dielectric layer 1610 stops on the contact points nearly simultaneously.

In one advantageous embodiment of the invention, the emitter 1050 comprises a layer of mono-silicon. As previously described, the mono-silicon emitter 1050 is grown in single epitaxial deposition step that forms the base layer 1010 and the emitter layer 1020. The mono-silicon emitter 1050 significantly reduces the emitter resistance (Re).

Figure 17:
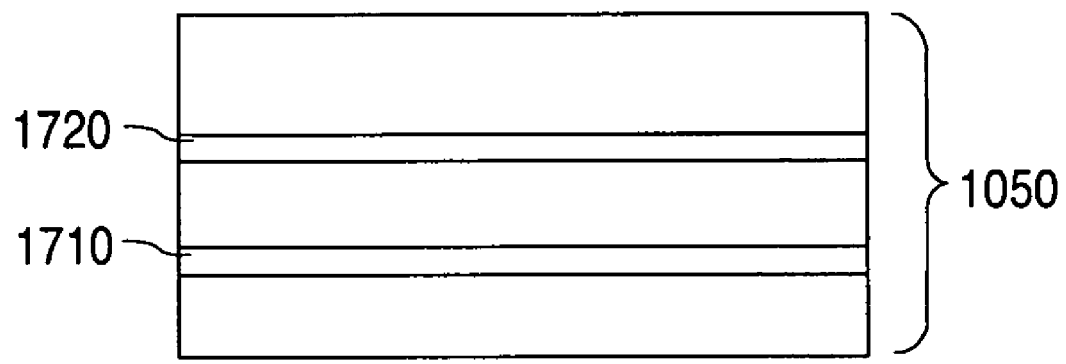
FIG. 17 illustrates a cross sectional view of an exemplary emitter stack of the present invention that comprises a first dopant layer and a second dopant layer.

In other advantageous embodiments of the invention, the emitter 1050 comprises one or more layers that have been doped with dopant impurities. FIG. 17 illustrates a cross sectional view of an exemplary emitter stack 1050 that has a first dopant layer 1710 and a second dopant layer 1720 grown in the epitaxial silicon of emitter 1050. The use of two dopant layers (1710 and 1720) is given as an example. The number of possible dopant layers is not limited to two dopant layers.

The dopant impurities may comprise such materials as arsenic (As), antimony (Sb), phosphorus (P), or boron (B). In addition, Carbon (C) may be added to the emitter 1050 to control or change the diffusion of the dopant or dopants. The location of the dopant layers (e.g., 1710 and 1720) in the emitter 1050 may be selected to control the dopant profile (atomic layer doping) and the emitter-base junction in the stack.

Figure 18:
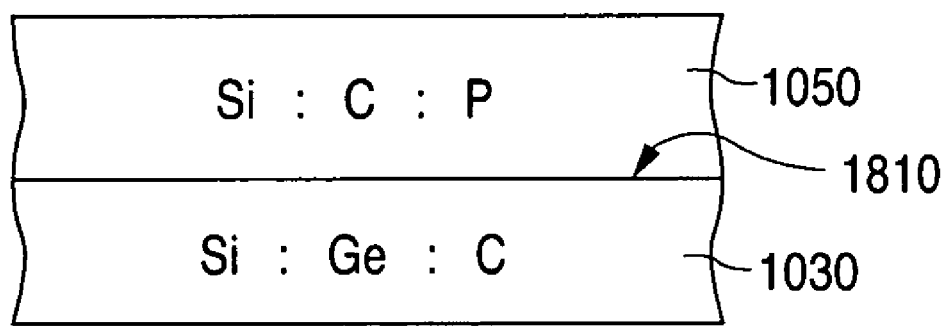
FIG. 18 illustrates a cross sectional view of an exemplary junction between an emitter and an epitaxial base portion of the present invention.

FIG. 18 illustrates a cross sectional view of an exemplary junction between the emitter 1050 and the epitaxial base portion 1030. The junction between the emitter 1050 and the epitaxial base portion 1030 is designated with reference numeral 1810. The emitter 1050 shown in FIG. 18 comprises silicon (Si) doped with carbon (C) and phosphorus (P). Although phosphorus (P) is a preferred dopant for the emitter 1050, other dopants may also be used. The epitaxial base portion 1030 shown in FIG. 18 comprises silicon (Si) doped with carbon (C) and a non-dopant impurity material germanium (Ge). Although germanium (Ge) is a preferred non-dopant impurity material for the epitaxial base portion 1030, other non-dopant impurity materials may also be used. As previously mentioned, the location of the junction 1810 may be controlled by the placement of dopant layers in the emitter 1050.

In one advantageous embodiment of the invention, the thickness of the emitter 1050 is optimized for high injection by manufacturing the emitter 1050 with a thickness that is less than or equal to one thousand five hundred Ångstroms (1500 Å).

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for manufacturing a bipolar junction transistor, said method comprising the steps of:
    forming a shallow trench isolation structure in a collector structure, the shallow trench isolation structure surrounding a base active area and a collector contact area;
    forming a window stack material over the collector structure, the window stack material covering the collector contact area and first portions of the shallow trench isolation structure, the window stack material not covering the base active area and second portions of the shallow trench isolation structure;
    forming a first base layer over the base active area and the window stack material, the first base layer comprising silicon material mixed with an impurity material;
    forming a second base layer that comprises substantially only silicon material over said first base layer;
    forming an emitter layer over said second base layer, said emitter layer comprising substantially only silicon material;
    placing a resist mask over a portion of said emitter layer;
    applying an etch procedure to etch exposed portions of said emitter layer to form an emitter under said resist mask; and
    continuing to apply said etch procedure to etch exposed portions of said second base layer down to said first base layer.

2. The method as set forth in claim 1 wherein the shallow trench isolation structure is formed over a deep trench isolation structure.

3. The method as set forth in claim 1 wherein atoms of said impurity material replace atoms of silicon in a crystal lattice of silicon in said first base layer in a manner that maintains a form of said crystal lattice of silicon.

4. The method as set forth in claim 3 wherein said impurity material is selected from the group consisting of: germanium, boron, phosphorus, arsenic, antimony and carbon.

5. The method as set forth in claim 1 wherein said emitter layer comprises a plurality of layers including at least one dopant layer.

6. The method as set forth in claim 1 wherein said step of forming the emitter layer comprises:
    forming at least one layer that comprises substantially only silicon material; and
    forming at least one layer that comprises silicon material mixed with a dopant impurity material.

7. The method as set forth in claim 6 wherein said dopant impurity material is selected from the group consisting of: germanium, phosphorus, boron, arsenic, antimony and carbon.

8. A method for manufacturing a bipolar junction transistor, said method comprising the steps of:
    forming a shallow trench isolation structure in a collector structure, the shallow trench isolation structure surrounding a base active area and a collector contact area;
    forming a window stack material over the collector structure, the window stack material covering the collector contact area and first portions of the shallow trench isolation structure, the window stack material not covering the base active area and second portions of the shallow trench isolation structure;
    forming a first base over the base active area and the window stack material, the first base layer comprising substantially only silicon material;
    forming a second base layer over the first base layer, the second base layer comprising silicon material mixed with an impurity material;
    forming a third base layer over the second base layer, the third base layer comprising substantially only silicon material;
    forming an emitter layer over the third base layer;
    placing a resist mask over a portion of said emitter layer;
    applying an etch procedure to etch exposed portions of said emitter layer to form an emitter under said resist mask; and
    continuing to apply said etch procedure to etch exposed portions of said third base layer down to said second base layer.

9. The method as set forth in claim 8 wherein the shallow trench isolation structure is formed over a deep trench isolation structure.

10. The method as set forth in claim 9 wherein the deep trench isolation structure is filled with a silicon material.

11. The method as set forth in claim 10 wherein atoms of said impurity material replace atoms of silicon in a crystal lattice of silicon in said second base layer in a manner that maintains a form of said crystal lattice of silicon.

12. The method as set forth in claim 11 wherein said impurity material is selected from the group consisting of: germanium, boron, phosphorus, arsenic, antimony and carbon.

13. The method as set forth in claim 8 wherein said emitter layer comprises substantially only silicon material.

14. The method as set forth in claim 8 wherein said step of forming the emitter layer comprises:
    forming at least one layer that comprises substantially only silicon material; and
    forming at least one layer that comprises silicon material mixed with a dopant impurity material.

15. The method as set forth in claim 14 wherein said dopant impurity material is selected from the group consisting of: germanium, phosphorus, boron, arsenic, antimony and carbon.

16. A method for manufacturing a bipolar junction transistor, said method comprising the steps of:
    forming a shallow trench isolation structure in a collector structure, the shallow trench isolation structure surrounding a base active area and a collector contact area;
    forming a window stack material over the collector structure, the window stack material covering the collector contact area and first portions of the shallow trench isolation structure, the window stack material not covering the base active area and second portions of the shallow trench isolation structure;
    forming a first base layer over at least the base active area and the window stack material, the first base layer comprising substantially only silicon material;

forming a second base layer over the first base layer, the second base layer comprising silicon material mixed with an impurity material;

forming a third base layer over the second base layer;

forming an emitter layer over the third base layer;

placing a resist mask over a portion of the emitter layer;

applying an etch procedure to etch exposed portions of the emitter layer to form an emitter under the resist mask; and continuing to apply the etch procedure to etch exposed portions of the third base layer down to the second base layer.

17. The method as set forth in claim 16 wherein the shallow trench isolation structure is formed over a deep trench isolation structure.

18. The method as set forth in claim 16 wherein atoms of said impurity material replace atoms of silicon in a crystal lattice of silicon in said second base layer in a manner that maintains a form of said crystal lattice of silicon.

19. The method as set forth in claim 18 wherein said impurity material is selected from the group consisting of: germanium, boron, phosphorus, arsenic, antimony and carbon.

20. The method as set forth in claim 16 wherein said emitter layer comprises substantially only silicon material.

\* \* \* \* \*